United States Patent
Sterrantino

(10) Patent No.: US 6,611,155 B2
(45) Date of Patent: Aug. 26, 2003

(54) INTERNALLY AND EXTERNALLY BIASED DUAL MODE 1394 COMPLIANT DRIVER

(75) Inventor: Scott Sterrantino, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/053,051

(22) Filed: Nov. 2, 2001

(65) Prior Publication Data

US 2002/0186047 A1 Dec. 12, 2002

Related U.S. Application Data

(60) Provisional application No. 60/296,980, filed on Jun. 8, 2001.

(51) Int. Cl.[7] .......................................... H03K 19/0175
(52) U.S. Cl. ........................ 326/86; 326/83; 326/127; 327/65; 327/108; 330/253; 330/258
(58) Field of Search ............................ 326/82, 83, 86, 326/89, 90, 127; 327/87, 65, 67, 108; 330/253, 258

(56) References Cited

U.S. PATENT DOCUMENTS

| | | | |
|---|---|---|---|
| 5,592,510 A | * | 1/1997 | Van Brunt et al. .......... 375/220 |
| 5,937,175 A | | 8/1999 | Sescila, III et al. |
| 6,061,746 A | | 5/2000 | Stanley et al. |
| 6,107,882 A | * | 8/2000 | Gabara et al. ............... 330/253 |
| 6,111,431 A | * | 8/2000 | Estrada ......................... 326/83 |
| 6,275,886 B1 | | 8/2001 | Levy |
| 6,281,715 B1 | * | 8/2001 | DeClue et al. ................ 327/65 |
| 6,286,063 B1 | | 9/2001 | Bolleman et al. |
| 6,286,071 B1 | | 9/2001 | Ijima |

* cited by examiner

Primary Examiner—Michael Tokar
Assistant Examiner—Vibol Tan
(74) Attorney, Agent, or Firm—April M. Mosby; Wade James Brady, III; Frederick J. Telecky, Jr.

(57) ABSTRACT

A dual mode output driver circuit within the architecture of a IEEE 1394-1995 IEEE 1394b compliant physical layer (PHY) circuit address the deficiencies of driver incompatibility between the first standard, IEEE 1394-1995, and the latest standard, IEEE 1394b. This output driver circuit of a serial bus structure which directly couples to a cable in a system for digital data transfer to and from the cable over the bus structure includes a current source, a first sub-circuit portion, a second sub-circuit portion, a switch and an amplifier. The first sub-circuit portion includes a reference voltage node. The current source connects to both the first and second sub-circuit portions to provide current. The second sub-circuit portion includes an external voltage bias node and a common mode voltage node, where the external voltage bias node connects to the cable. The switch couples between the first and second sub-circuit portions to provide an internal voltage bias operation mode and an external voltage bias operation mode for the output driver circuit in response to an enable signal. The switch couples to receive a reference voltage, an internal bias voltage, and a common mode voltage. The amplifier connects the switch to the first and second sub-circuit portions to supply an amplified difference between the common mode voltage and the internal bias voltage in the internal voltage bias operation mode and to amplify the difference between the reference voltage and the common mode voltage in the external voltage bias operation mode. The amplifier provides this amplified difference to the first and second sub-circuit portions. Thereby, the dual mode driver in accordance with the invention allows either an external voltage bias to drive current that regulated over a range of external biasing or an internal voltage bias to drive current within the driver circuitry.

13 Claims, 1 Drawing Sheet

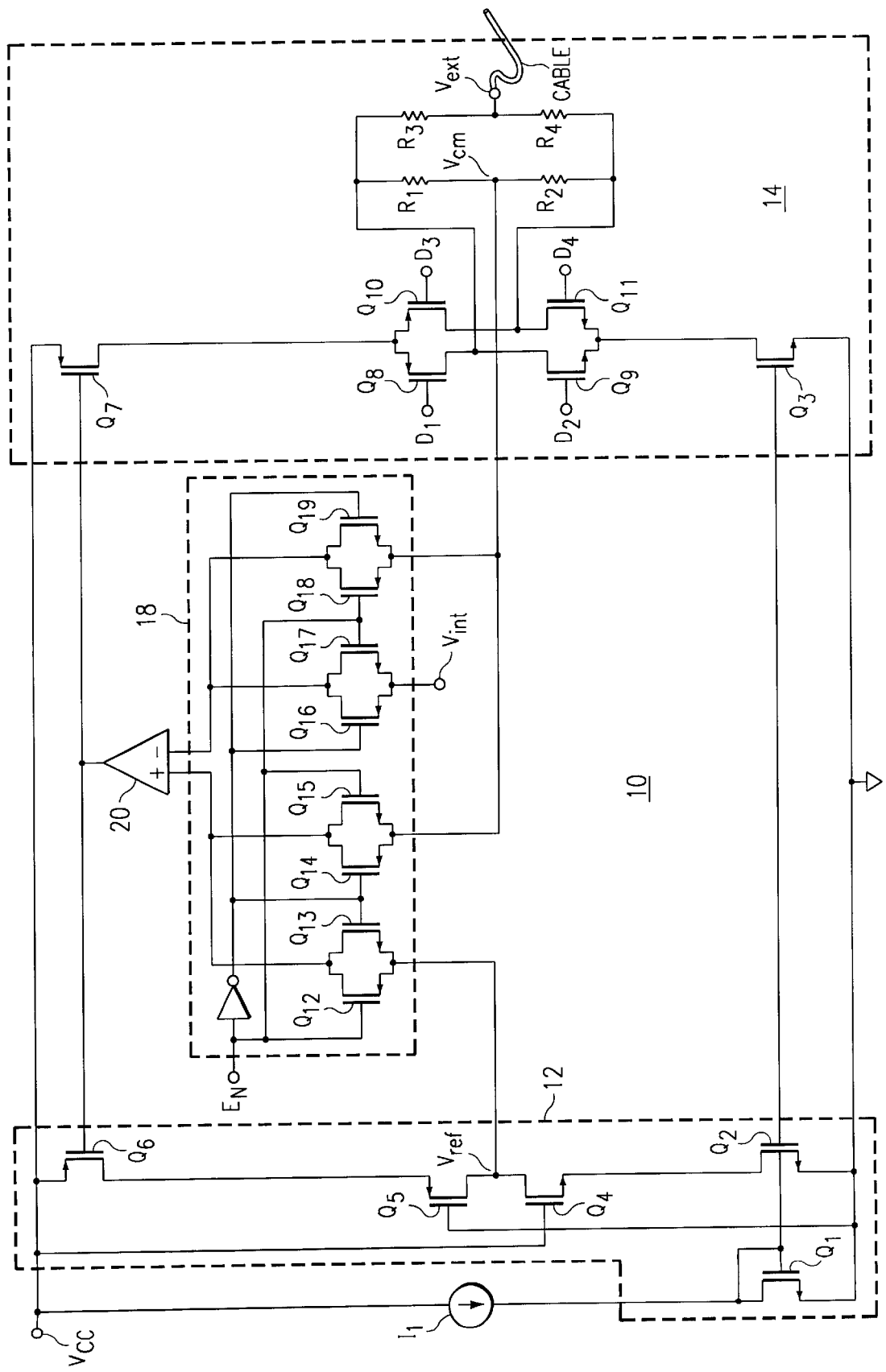

INTERNALLY AND EXTERNALLY BIASED DUAL MODE 1394 COMPLIANT DRIVER

This application claims the benefit of provisional application 60/296,980 filed Jun. 8, 2001.

FIELD OF THE INVENTION

The present invention relates to drivers, and, more particularly, to a dual mode IEEE 1394-1995/1394b compliant output driver circuit having an internal and external voltage bias.

BACKGROUND OF THE INVENTION

Under Institute of Electrical and Electronic Engineers' (IEEE) standard 1394, a serial bus architecture is capable of providing transmission of multimedia data. This IEEE 1394-1995 standard has revolutionized the transport of digital data for professional and consumer electronics products and computers. By providing an affordable high-speed method of interconnecting digital devices, a more versatile I/O connection has been established. This serial bus architecture is the basis for the integration of all devices involving the transport of digital data including electronic entertainment, communication, and computing, as well as, test and measurement, command and control, and computer peripherals. The scalable architecture and flexible peer-to-peer topology makes IEEE 1394-1995 ideal for connecting devices ranging from printers and computer hard drives to digital audio and video hardware with real time processing requirements for on-time multimedia.

An updated version of the IEEE 1394-1995 standard, IEEE 1394b, provides a high performance serial bus architecture for mass storage, consumer electronics and automotive applications. Specifically, the new standard IEEE 1394b not only doubles the speed of the previous generation of IEEE 1394-1995 devices up to 800, 1600 and 3200 megabits-per-second (Mbps), it also increases distances up to 100 meters. Thus, this updated standard opens the way for new applications for the 1394 high performance serial bus including the FireWire® serial bus architecture developed by Apple® and Texas Instruments Inc®. These enhanced features allow designers of PCs, mass storage, consumer electronics and automotive applications to increase the functionality of designs while simplifying architecture and reducing costs. In particular, the IEEE 1394b serial bus design is ideal for high-bandwidth applications like multimedia. In addition to providing high-speed access, IEEE 1394b supports plug-and-play connections, hot swapping, multiple speeds on the same bus, and isochronous data transfer, as well as providing power to peripheral devices. Thus, the benefits of a system compliant with the new standard include a simple to operate, seamlessly integrated network of digital multimedia peripherals.

The IEEE 1394 standard defines a protocol including a serial bus management block coupled to a transaction layer, a link layer and a physical layer. The physical layer provides the electrical and mechanical connection between a device or application and the IEEE 1394 cable. The physical layer also provides arbitration to ensure that all devices coupled to the IEEE 1394 bus have access to the bus as well as actual data transmission and reception.

Architecture compliant with IEEE 1394 includes a central processing unit coupled to local memory and a link layer by a processor bus. The link layer couples to a physical layer using control and data signals. The physical layer connects directly to the cable that couples all other peripheral devices in a network or system.

Difficulties arise when a peripheral having the old 1394-1995 standard couples to a network that is compliant with the new standard. Specifically, the driver in the physical layer of IEEE's 1394-1995 standard is regulated over a range of external biasing voltages. In contrast, however, a driver in a physical layer in compliance with the IEEE 1394b standard is regulated over a range of internal biasing voltages.

There is a need for communication between devices that use both IEEE 1394-1995 and IEEE 1394b as their basic transport layer of the network communications system. Accordingly, some drivers compliant with IEEE 1394b must be backwards compatible with any peripheral device that complies with the old standard, IEEE 1394-1995.

Thus, there exists a need for a dual mode driver, having the capability of being externally biased in compliance with IEEE 1394-1995 standard and the capability of being internally biased in compliance with IEEE's 1394b standard.

SUMMARY OF THE INVENTION

To address the above-discussed deficiencies of driver incompatibility between the first standard, IEEE 1394-1995, and the latest standard, IEEE 1394b, the present invention teaches a dual mode output driver circuit within the architecture of a IEEE 1394b compliant physical layer (PHY) circuit. The output driver circuit in accordance with the present invention of a serial bus structure directly coupled to a cable in a system for digital data transfer to and from the cable over the bus structure includes a current source, a first sub-circuit portion, a second sub-circuit portion, a switch and an amplifier. The first sub-circuit portion includes a reference voltage node. The current source connects to both the first and second sub-circuit portions to provide current. The second sub-circuit portion includes an external voltage bias node and a common mode voltage node, where the external voltage bias node connects to the cable. The switch couples between the first and second sub-circuit portions to provide an internal voltage bias operation mode and an external voltage bias operation mode for the output driver circuit in response to an enable signal. The switch couples to receive a reference voltage through the reference voltage node and a common mode voltage through the common-mode voltage node. In addition, an internal bias voltage is supplied to the switch. In the internal voltage bias operation mode, the amplifier connects the switch to the first and second sub-circuit portions to amplify and supply the difference between the common mode voltage and the internal bias voltage. In the alternative, the amplifier connects the switch to the first and second sub-circuit portions to amplify and supply the difference between the reference voltage and the common mode voltage while operating in the external voltage bias mode.

Thereby, the dual mode driver in accordance with the invention allows either an external voltage bias to drive current that is regulated over a range of external biasing voltages or an internal voltage bias to drive current within the driver. The output driver circuit forces the bias on the cable. The voltage bias is strong enough to overcome weak biasing from a receiver connected at the other end of the cable. In addition, proper drive currents are maintained through voltage matching of the reference voltage in the external bias mode.

Advantages of this design include but are not limited to a dual-mode output driver circuit having a significant decrease in silicon area and a significant decrease in output capacitance due to less required circuitry at the output of the driver.

This output driver has enhanced matching due to minimal crowding of circuitry near the bondpad and due to a lower required power. In addition, the output driver in accordance with the present invention eliminates the need for redundant current voltage references required by an approach that makes use of multiple drivers to provide an internal bias voltage mode and an external bias voltage mode.

BRIEF DESCRIPTION OF THE DRAWINGS

For a more complete understanding of the present invention and the advantages thereof, reference is now made to the following description taken in conjunction with the accompanying drawing in which like reference numbers indicate like features and wherein:

The FIGURE illustrates a dual mode output driver circuit in accordance with the present invention.

DETAILED DESCRIPTION OF THE PREFERRED EMBODIMENT

The FIGURE illustrates an output driver circuit 10 in accordance with the present invention contained within a serial bus structure which connects directly to a cable (not shown) for the transfer of digital data within a computing system. The output driver circuit 10 includes a current source $I_1$, a first sub-circuit portion 12, a second sub-circuit portion 14, a switch 18 and an amplifier 20. The first sub-circuit portion 12 includes a current mirror, comprising transistors $Q_1$ and $Q_2$; transistors $Q_4$ and $Q_5$ coupled to form a reference voltage node, $V_{ref}$; and a transistor $Q_6$. The second sub-circuit portion 14 includes a current mirror, comprising transistors, $Q_1$ and $Q_3$. Transistors $Q_{8-Q11}$ and resistors $R_{1-R4}$ couple to from an external voltage bias node, $V_{ext}$, and a common mode voltage node, $V_{cm}$, where the external voltage bias node $V_{ext}$ connects to the cable (not shown). The current source 11 connects to the respective current mirrors in each of the first and second sub-circuit portions, 12 and 14, to provide current. Switch 18 couples between the first and second sub-circuit portions, 12 and 14, to provide an internal voltage bias operation mode and an external voltage bias operation mode for the output driver circuit in response to an enable signal receive at enable signal node EN. The switch 18 couples to receive a reference voltage through the reference voltage node, $V_{ref}$, and a common mode voltage through the common-mode voltage node, $V_{cm}$. In addition, an internal bias voltage, $V_{int}$, is supplied to switch 18. In the internal voltage bias operation mode, the amplifier 20 connects switch 18 to transistors $Q_6$ and $Q_7$ to amplify and supply the difference between the common mode voltage, $V_{cm}$, and the internal bias voltage, $V_{int}$, to the first and second sub-circuit portions, 12 and 14, respectively. In the alternative, the amplifier 20 connects switch 18 to the first and second sub-circuit portions 12 and 14 to amplify and supply the difference between the reference voltage, $V_{ref}$, and the common mode voltage, $V_{cm}$, while operating in the external voltage bias mode.

In operation, a reference current from current source $I_1$ flows through transistor $Q_1$ and is mirrored onto transistors $Q_2$, $Q_4$, $Q_5$ and $Q_6$, turning transistors $Q_4$ and $Q_5$ on. The purpose of transistors $Q_4$ and $Q_5$ are to match the voltage drop across transistors $Q_8$, $Q_9$, $Q_{10}$ and $Q_{11}$ at the output. Thus, transistors $Q_4$ and $Q_5$ must be sized such that the voltage drop across them is the same as the voltage drop across transistors $Q_8$, $Q_9$, $Q_{10}$ and $Q_{11}$. Gates of transistors $Q_8$, $Q_9$, $Q_{10}$ and $Q_{11}$ couple to digital signals at nodes $D_1$, $D_2$, $D_3$ and $D_4$. These signals switch these transistors $Q_8$, $Q_9$, $Q_{10}$ and $Q_{11}$, on and off. The voltage across transistor $Q_4$ is the voltage applied to voltage node $V_{ref}$ minus the voltage drop across transistor $Q_2$. In the first mode, the external bias is sensed by the node $V_{cm}$. The enable signal for the enable node EN of switch 18 switches low such that the two pass-gates formed by transistors $Q_{12}$, $Q_{13}$, $Q_{18}$, and $Q_{19}$ are enabled. As a result, voltage from node $V_{ref}$ is the positive input for amplifier 20 and voltage from node $V_{cm}$ is the negative input for op-amp 20. The external voltage bias $V_{ext}$ is used to generate the common mode voltage at voltage node $V_{cm}$, wherein resistors $R_1$ and $R_2$ sense the common mode voltage and resistors $R_3$ and $R_4$ provide impedance matching for any cable that will connect to the serial bus structure. If voltage $V_{cm}$ is greater than the voltage $V_{ref}$, the output of the amplifier 20 will be lowered which forces more current to flow through transistors $Q_6$ and $Q_7$. The current at transistor $Q_6$ is mirrored through transistor $Q_7$ in the saturation and triode regions due to the coupling of the gates and sources of both transistors $Q_6$ and $Q_7$. As a result, the voltage at node $V_{cm}$ is forced to the voltage at node $V_{ref}$.

In the second mode, the internal voltage bias $V_{int}$ is sensed by switch 18. The current that flows through transistor $Q_1$ is mirrored to flow through transistors $Q_2$, $Q_4$, $Q_5$ and $Q_6$. The enable signal EN of switch 18 switches high such that the two pass-gates formed by transistors $Q_{14}$, $Q_{15}$, $Q_{16}$, and $Q_{17}$ are enabled. As a result, voltage from voltage node $V_{int}$ is the negative input for amplifier 20 and the internal voltage from node voltage node $V_{cm}$ is the positive input for amplifier 20. At this point, voltage $V_{ext}$ is non-existent and, hence, driver circuit 10 generates the common mode voltage at node $V_{cm}$. Even a weak bias received at the external voltage bias node $V_{ext}$ from a cable will not alter the common mode voltage of node $V_{cm}$ due to the strength of the internal bias voltage at node $V_{int}$. In most cases, the common mode voltage at node $V_{cm}$ is lower than the voltage at node $V_{int}$ which lowers the output of the amplifier 20 forcing more current to pass through transistor $Q_7$ which pulls the common mode voltage node $V_{cm}$ up to the power supply rail voltage $V_{CC}$. At the same time, current across transistor $Q_3$ pulls node $V_{cm}$ down to ground. When the voltage at the common mode voltage node $V_{cm}$ and internal voltage bias node $V_{int}$ are equal, current from transistors $Q_3$ and $Q_7$ balances. Ultimately, the common mode voltage at node $V_{cm}$ is forced to the internal voltage bias at node $V_{int}$.

Advantages of this design include but are not limited to a dual mode driver for the physical layer of an IEEE 1394b compliant serial bus having a high performance, simple, and cost effective design. Specifically, the driver in accordance with the present invention makes a IEEE 1394b serial. bus backwards compliant with the earlier released standard IEEE 1394-1995.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. An output driver circuit of a serial bus structure directly coupled to a cable in a system for digital data transfer to and from the cable over the bus structure, the output driver circuit having a power supply rail and ground, comprising:
   a current source;
   a first sub-circuit portion having a reference voltage node, the first sub-circuit portion coupled to the current source;
   a second sub-circuit portion coupled to the current source, the second sub-circuit portion having an external voltage bias node and a common mode voltage node, the external voltage bias node coupled to the cable;
   a switch coupled between the first and second sub-circuit portions to provide an internal voltage bias operation mode and an external voltage bias operation mode for the output driver circuit, the switch having a reference voltage input, an internal bias voltage input, a common mode voltage input and a pair of outputs, the reference voltage input coupled to the reference voltage node, the common mode voltage input coupled to the common mode voltage bias node; and
   an amplifier having a positive and a negative input and an output, each coupled to a respective one of the pair of outputs of the switch to amplify the difference between the internal bias voltage and the common mode voltage in the internal voltage bias operation mode and to amplify the difference between the reference voltage and the common mode voltage in the external voltage bias operation mode, the output coupled to the first and second sub-circuit portions to provide the amplified difference to the first and second sub-circuit portions.

2. The output driver circuit as recited in claim 1, wherein the first sub-circuit portion comprises:
   a current mirror coupled to the current source to mirror the current provided by the current source;
   a first transistor having a gate, a drain and a source, the source coupled to receive the current from the current mirror, the gate coupled to the power supply rail;
   a second transistor having a gate, a drain and a source, the drain coupled to the drain of the first transistor to form the reference voltage node, the gate coupled to ground; and
   a third transistor having a gate, a drain and a source, the drain coupled to the source of the second transistor, the source coupled to the power supply rail, the gate coupled to the output of the amplifier.

3. The output driver circuit as recited in claim 2, wherein the current mirror comprises:
   a fourth transistor having a gate, a drain and a source, the drain and gate coupled to the current source, the source coupled to ground; and
   a fifth transistor having a gate, a drain and a source, the gate coupled to the gate of the fourth transistor, the drain coupled to the source of the first transistor, the source coupled to ground.

4. The output driver circuit as recited in claim 1, wherein the second sub-circuit portion comprises:
   a current mirror coupled to the current source to mirror the current provided by the current source;
   a first transistor having a gate, a drain and a source, the source coupled to the current mirror, the gate coupled to a first digital data node;
   a second transistor having a gate, a drain and a source, the source coupled to the source of the first transistor, the gate coupled to a second digital data node;
   a third transistor having a gate, a drain and a source, the drain coupled to the drain of the first transistor, the gate coupled to a third digital data node;
   a fourth transistor having a gate, a drain and a source, the drain coupled to the drain of the second transistor, the gate coupled to a fourth digital data node;
   a fifth transistor having a gate, a drain and a source, the gate coupled to the output of the amplifier, the source coupled to the power supply rail, the drain coupled to the drain of the third and fourth transistor;
   a first resistor coupled between the drain of the first transistor and the common mode voltage node;
   a second resistor coupled between the drain of the second transistor and the common mode voltage node;
   a first impedance matching resistor coupled between the drain of the first transistor and the external bias voltage node; and
   a second impedance matching resistor coupled between the drain of the first transistor and the external bias voltage node.

5. The output driver circuit as recited in claim 4, wherein the current mirror comprises:
   a sixth transistor having a gate, a drain and a source, the drain and gate coupled to the current source, the source coupled to ground; and
   a seventh transistor having a gate, a drain and a source, the gate coupled to the gate of the sixth transistor, the drain coupled to the source of the first transistor, the source coupled to ground.

6. The output driver circuit as recited in claim 1, wherein the switch comprises:
   an inverter coupled to receive the enable signal to provide an inverted enable signal;
   a first pass-gate circuit coupled between the reference voltage input and the positive input of the amplifier, the first pass-gate circuit coupled to receive the enable signal and the inverted enable signal;
   a second pass-gate circuit coupled between the common-mode voltage input and the positive input of the amplifier, the second pass-gate circuit coupled to receive the enable signal and the inverted enable signal;
   a third pass-gate circuit coupled between the internal bias voltage input and the negative input of the amplifier, the third pass-gate circuit coupled to receive the enable signal and the inverted enable signal; and
   a fourth pass-gate circuit coupled to the common-mode voltage input and the negative input of the amplifier, the second pass-gate circuit coupled to receive the enable signal and the inverted enable signal.

7. The output driver circuit as recited in claim 6, wherein the first pass-gate circuit comprises:
   a n-type transistor having a drain, a source, and a gate, the gate coupled to receive the inverted enable signal, the drain coupled to the positive input of the amplifier, the source coupled to the reference voltage node ; and
   a p-type transistor having a drain, a source, and a gate, the gate coupled to receive the enable signal, the drain coupled to positive input of the amplifier, the source coupled to the reference voltage node.

8. The output driver circuit as recited in claim 6, wherein the second pass-gate circuit comprises:

a n-type transistor having a drain, a source, and a gate, the gate coupled to receive the enable signal, the drain coupled to the positive input of the amplifier, the source coupled to the common-mode voltage node; and a p-type transistor having a drain, a source, and a gate, the gate coupled to receive the inverted enable signal, the drain coupled to positive input of the amplifier, the source coupled to the common-mode voltage node.

9. The output driver circuit as recited in claim 6, wherein the third pass-gate circuit comprises:

a n-type transistor having a drain, a source, and a gate, the gate coupled to receive the enable signal, the drain coupled to the negative input of the amplifier, the source coupled to the internal bias voltage node; and a p-type transistor having a drain, a source, and a gate, the gate coupled to receive the inverted enable signal, the drain coupled to negative input of the amplifier, the source coupled to the internal bias voltage node.

10. The output driver circuit as recited in claim 6, wherein the fourth pass-gate circuit comprises:

a n-type transistor having a drain, a source, and a gate, the gate coupled to receive the inverted enable signal, the drain coupled to the negative input of the amplifier, the source coupled to the common-mode voltage node; and a p-type transistor having a drain, a source, and a gate, the gate coupled to receive the enable signal, the drain coupled to negative input of the amplifier, the source coupled to the common-mode voltage node.

11. The output driver circuit as recited in claim 1, wherein the bus structure is an IEEE 1394-1995/IEEE1394b bus structure.

12. An output driver circuit of a serial bus structure directly coupled to a cable in a system for digital data transfer to and from the cable over the bus structure, the output driver circuit having a power supply rail and ground, comprising:

a current source;

a first current mirror coupled to the current source to mirror the current provided by the current source;

a first transistor having a gate, a drain and a source, the source coupled to receive the current from the current mirror, the gate coupled to the power supply rail;

a second transistor having a gate, a drain and a source, the drain coupled to the drain of the first transistor to form a reference node, the gate coupled to ground;

a third transistor having a gate, a drain and a source, the drain coupled to the source of the second transistor, the source coupled to the power supply rail;

a switch having a first, a second and a third input and a first and a second output, the first input coupled to the reference node, the second input coupled to an internal bias voltage node to switch between a first and a second mode of operation;

an amplifier having a positive input, a negative input, and an output, the positive input coupled to the first output of the switch, the negative input coupled to the second output of the -switch, the output coupled to the gate of the third transistor;

a fourth transistor having a gate, a drain and a source, the gate coupled to the gate of the third transistor, the source coupled to the power supply rail;

an output circuit having a common mode voltage node and an external bias voltage node, the common mode voltage node coupled to the third input of the switch, the output circuit coupled to the drain of the fourth transistor; and a second current mirror coupled between the current source and the output circuit to mirror the current provided by the current source.

13. The output driver circuit as recited in claim 12, wherein the output circuit comprises:

a fifth transistor having a gate, a drain and a source, the source coupled to current mirror, the gate coupled to a first digital data node;

a sixth transistor having a gate, a drain and a source, the source coupled to current mirror, the gate coupled to a second digital data node;

a seventh transistor having a gate, a drain and a source, the drain coupled to the drain of the fifth transistor, the gate coupled to a third digital data node, the source coupled to the drain of the fourth transistor;

a eighth transistor having a gate, a drain and a source, the drain coupled to the drain of the sixth transistor, the gate coupled to a fourth digital data node, the source coupled to the drain of the fourth transistor;

a first resistor coupled between the drain of the first transistor and the common mode voltage node;

a second resistor coupled between the drain of the second transistor and the common mode voltage node;

a first impedance matching resistor coupled between the drain of the first transistor and the external bias voltage node; and a second impedance matching resistor coupled between the drain of the first transistor and the external bias voltage node.

* * * * *